United States Patent [19]

Iranmanesh

[11] Patent Number: 5,572,062

[45] Date of Patent: Nov. 5, 1996

[54] ANTIFUSE WITH SILICON SPACERS

[75] Inventor: Ali A. Iranmanesh, Sunnyvale, Calif.

[73] Assignee: Crosspoint Solutions, Inc., Santa Clara, Calif.

[21] Appl. No.: 221,344

[22] Filed: Mar. 31, 1994

[51] Int. Cl.⁶ .............................. H01L 29/00; H01L 29/04
[52] U.S. Cl. ............................ 257/530; 257/50; 257/52; 257/543
[58] Field of Search ................................. 257/529, 530, 257/50, 209, 543, 52

[56] References Cited

U.S. PATENT DOCUMENTS

| 5,166,556 | 11/1992 | Hsu et al. | 257/530 |
| 5,250,464 | 10/1993 | Wong et al. | 437/170 |
| 5,272,101 | 12/1993 | Forouhi et al. | 257/530 |
| 5,369,054 | 11/1994 | Yen et al. | 437/195 |
| 5,384,481 | 1/1995 | Holzworth et al. | 257/530 |

Primary Examiner—Sara W. Crane
Assistant Examiner—Valencia Martin Wallace
Attorney, Agent, or Firm—Townsend and Townsend and Crew LLP

[57] ABSTRACT

A method and resulting antifuse structure in an integrated circuit include a first metal interconnection layer on a first insulating layer over the substrate of the integrated circuit, a second insulating layer over the first metal interconnection layer. The second insulating layer has a via therein and a programming layer is located in the via. Such programming layer includes a first region on the first metal interconnection layer which is removed from sides of the second insulating layer in the via, and a second region on the sides of the second insulating layer via. The first region has substantially a first thickness, the second region has substantially a second thickness which is greater than the first thickness. Upon programming the antifuse structure, a conducting link forms in the first region of the programming layer.

14 Claims, 6 Drawing Sheets

1

ANTIFUSE WITH SILICON SPACERS

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of antifuse material, such as amorphous silicon, silicon dioxide or silicon nitride, is sandwiched between two metal interconnection lines. Depending upon the material of each metal interconnection layer, a layer of barrier metal, such as TiW (titanium-tungsten), is placed between the programming layer and each metal interconnection layer. Barrier metal layers function to block the undesired interdiffusion of material from a programming layer, such as amorphous silicon, and material from a metal layer, such as aluminum alloy. Barrier metal layers are typically refractory metals, their intermetallics, alloys, silicides, nitrides and combinations thereof.

Various problems have been found with present day antifuses. One problem is that the programmed resistance ($R_{ON}$) typically varies between 30 to 150 ohms depending upon the current used to program the antifuse. While these values are low enough for FPGA's to operate quite adequately, even lower resistance values would significantly improve performance. Thus a goal of any antifuse is to lower $R_{ON}$ as much as possible. Furthermore, it is highly desirable that the range of resistance values be decreased so that the performance of the FPGA be more predictable.

A second problem with present antifuses is that voltages to program the antifuses tend to vary widely. Circuit and process designs must be made to accommodate these variations, which adversely affect the cost and performance of the integrated circuit incorporating these antifuses.

The present invention solves or substantially mitigates these problems. A further advantage is that the present invention can be incorporated into existing antifuse processes without radical and expensive changes.

SUMMARY OF THE INVENTION

The present invention provides for a method of forming an antifuse in an integrated circuit having a first insulating layer on a semiconductor substrate. The method comprises the steps of forming a first metal interconnection layer on the insulating layer; forming a first barrier metal layer on the first metal interconnection layer; forming a second insulating layer over the first barrier metal layer; forming a via through the second insulating layer where the antifuse is to be located to expose a portion of the first barrier metal layer; forming a spacer region in the via, the spacer region located on the via sides and on part of the first barrier metal portion next to the second insulating layer sides; forming a programming layer on the second insulating layer and the first barrier metal layer in the via; forming a second barrier metal layer (or second antifuse electrode) on the programming layer; and forming a second metal interconnection layer on the second barrier metal layer. The spacer region forces programming of the antifuse away from the sides of the via in the second insulating layer.

The resulting antifuse structure in an integrated circuit device has a first metal interconnection layer on a first insulating layer over the substrate of the integrated circuit; a second insulating layer over the first metal layer and the first metal interconnection layer, the second insulating layer having a via exposing the first metal interconnection layer therein; a programming layer in the via, the programming layer having a first region on the first metal interconnection layer and removed from sides of the second insulating layer in the aperture, and a second region on the sides of the second insulating layer, the first region having substantially a first thickness, the second region having substantially a second thickness, the second thickness greater than the first thickness; and a second metal interconnection layer on the amorphous silicon layer. Upon programming of the antifuse structure, a conducting link is formed in the first region of the programming layer.

With programming occurring in the first region of the amorphous silicon layer, rather than the second region, a conducting link which has a lower and more reliable $R_{ON}$ resistance is formed. Furthermore, the programming voltages are more consistent compared to present day antifuses.

BRIEF DESCRIPTION OF THE DRAWINGS

A more detailed understanding of the present invention may be achieved by perusing the following Detailed Description of Preferred Embodiments of the present invention with reference to the following drawings.

DETAILED DESCRIPTION OF PREFERRED EMBODIMENTS

Figure 1A:
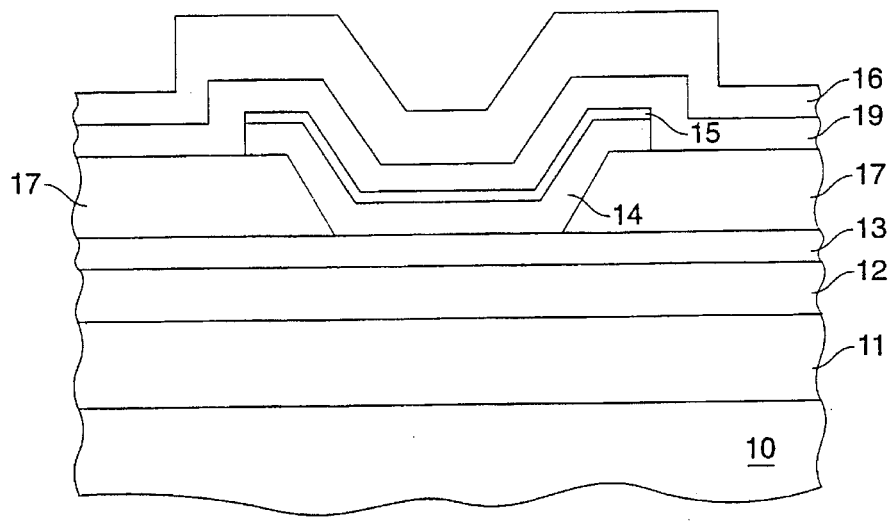
FIG. 1A is a cross-sectional diagram of a representative antifuse found in the prior art.

FIG. 1A shows a cross-sectional view of a typical antifuse. The antifuse has a first metal interconnection layer 12 on top of an insulating layer 11 of silicon dioxide. The insulating layer 11 is formed on top of a semiconductor substrate 10 upon whose surface are formed various elements of an integrated circuit. These elements, such as transistors, are not shown in the drawings.

The first metal interconnection layer 12 is typically formed from aluminum alloy. A first barrier metal layer 13 is foxed on top of the first metal interconnection layer 12. The layers 12 and 13 are delineated into one set of metal interconnection lines for the integrated circuit. A second insulating layer 17 of silicon dioxide is placed over the first metal interconnection layer 12 and first barrier metal layer 13. Though an aperture, or via, through the layer 17, a programming layer 14 of amorphous silicon is formed on top of the second insulating layer 17 and in the via to contact the first barrier metal layer 13. As explained above, the barrier metal layer 13 prevents the interdiffusion of the aluminum in the metal interconnection layer 12 with the silicon in the programming layer 14.

On top of the programming layer 14, there is placed a thin barrier metal layer 15. An antifuse mask is used to delineate the layers 14 and 15 in the via and its surrounding regions. A third barrier metal layer 19, which is followed by a second metal interconnection layer 16 of aluminum, is deposited in contact with the barrier metal layer 15 and the edge of the programming layer 14. The layers 16 and 19 are delineated into another set of metal interconnection lines for the integrated circuit.

When an antifuse is programmed by placing a large voltage across the metal interconnection lines (the layers 12, 13 and the layers 16, 19), a conducting link is formed through the previously nonconducting programming layer 14 between the barrier metal layers 13 and 15. The link is typically at the corners of the antifuse in the via through the insulating layer 17. The conducting link is formed by the higher electric fields at the corners at the beginning of the programming process. These fields cause a breakdown of the programming layer 14 in those locations and the resulting high current densities melt the barrier metal layers 13 and 15 and the intermediate programming layer 14 of amorphous silicon into the fused link.

As noted above, there are two problems with present day antifuses. The resistance of the programmed antifuse varies considerably. The source of this problem appears to be the location of the conducting link. It is believed that the conductivity, or conversely, the resistance, of the programmed link is determined by the amount of barrier metal which combines with the silicon in the programming layer 14 to form the conducting metal silicide link. Since the link is located at the corner, there is a limited amount of barrier metal available, compared to a location near the center of the via. In the via center the silicide link can draw barrier metal from all directions so that more metal can be combined for a link with lower resistance and greater reliability.

Figure 1B:
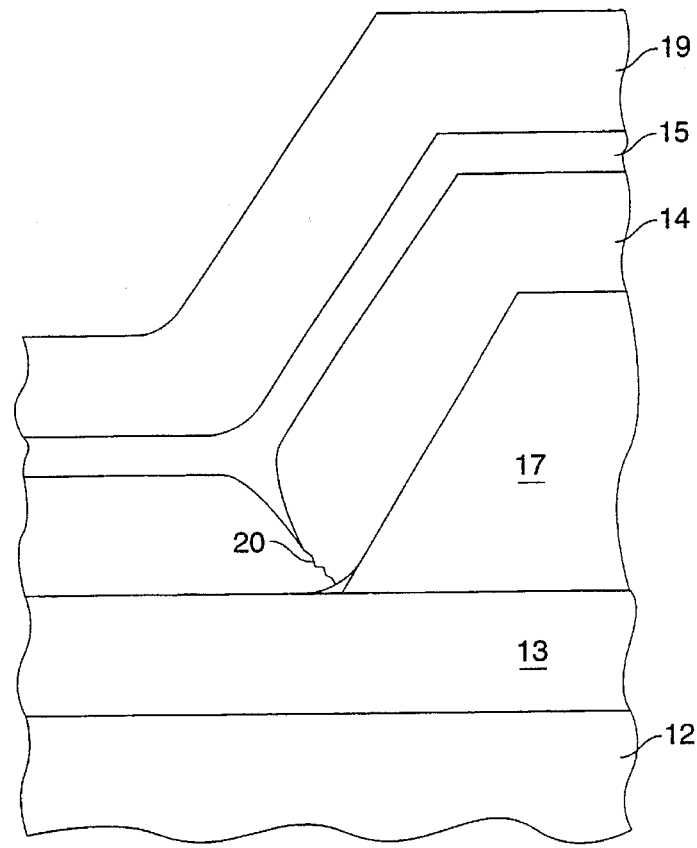
FIG. 1B is a detailed view of one corner of the antifuse of FIG. 1A.

Secondly, the uneven deposition of the programming layer 14 of amorphous silicon at the corners of the via, as shown in FIG. 1B, which details a corner of the antifuse in FIG. 1A, is believed to be the source of the wide variation in programming voltages. As can be seen, most of the programming layer 14 has a rather uniform thickness, except at the via corner where the insulating layer 17 and the barrier layer 13 meet. At this point, the abrupt change from the horizontal top of the barrier metal layer 13 to the steeply sloped sides of the antifuse aperture in the insulating layer 17 causes an irregularity in the programming layer 14, which is a consequence of chemical vapor deposition used to form the programming layer 14.

As shown in FIG. 1B, the irregularity in the programming layer 14 is a crease at the corner with mounds on either side. In the programming of the antifuse, the programming layer 14 melts in the corner region. Specifically, the rupture occurs in the crease where the programming layer 14 is thinnest. Dotted arrow 20 shows the distance of the thinnest portion of the programming layer 14 at the corner of the antifuse structure. The thickness of the programming layer 14 at this point is difficult to control and is very much subject to the vagaries of semiconductor processing. Hence, there is no uniformity in thickness at this point from wafer to wafer or even from antifuse to antifuse within an integrated circuit. With this variation in thickness, the programming voltages necessarily also vary.

The present invention moves the programming point away from the corners of the via through the insulating layer 17 by creating spacers on the sides of the via. The result is that the programming layer 14 is thickest at the corners and thinnest at the flat portions in the center of the via. The thickness of the programming layer 14 in this region may be controlled with much greater effectiveness than in the via corners.

Figure 2A:
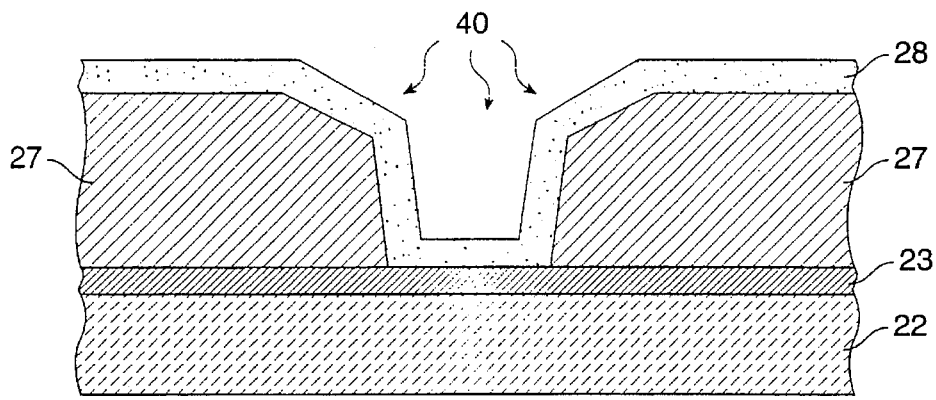
FIGS. 2A–2F show a sequence of steps used to manufacture an antifuse structure according to one embodiment of the present invention.

FIGS. 2A–2F illustrate the steps of manufacturing an antifuse according to the present invention. It should be noted that the same masks for the antifuse illustrated in FIG. 1A may be used so that the present invention may be easily adapted to existing antifuse processes. FIG. 2A shows a step in the manufacture of an antifuse which is the same as that used for the antifuse shown in FIG. 1A. That is, FIG. 2A illustrates the point in the process in which an insulating layer 27, the interlayer dielectric, has been deposited on the first metal interconnection line formed by an aluminum layer 22 and a barrier metal layer 23, also called a conductive layer or electrode. A via 40 is formed through the insulating layer 27 where the antifuse is to be formed and a spacer layer 28 of amorphous silicon is deposited over the layer 27 and into the via. Typically, the amorphous silicon layer 28 is deposited by plasma-enhanced chemical vapor deposition to a nominal thickness of 1000 Å.

Figure 5:
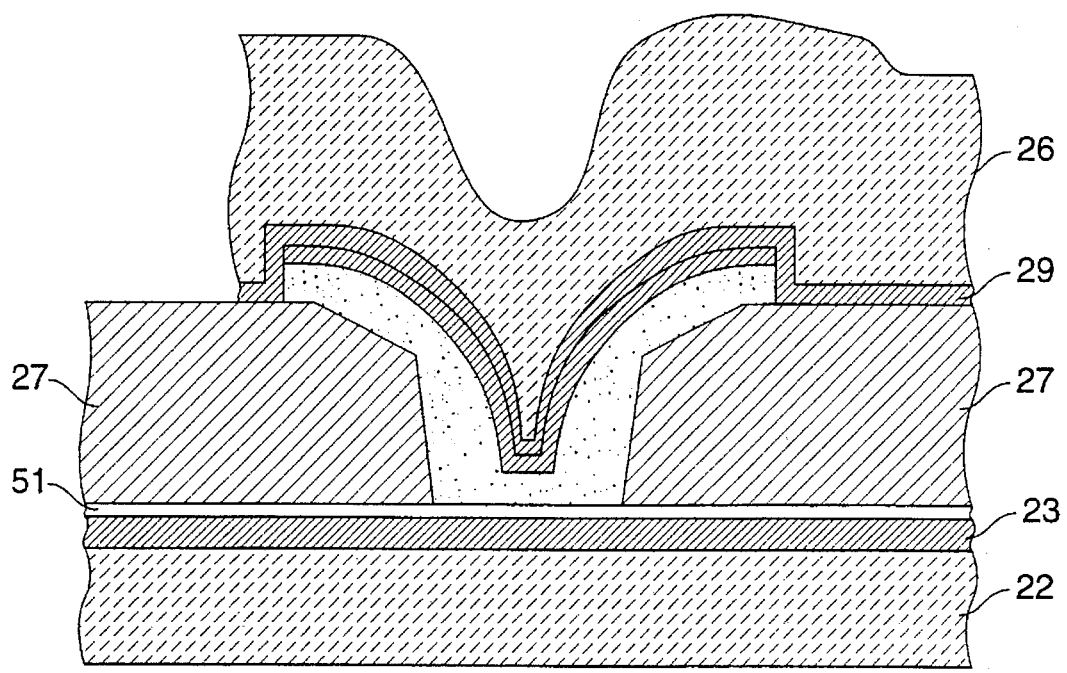
FIG. 5 shows an alternative-embodiment with etch stop layer according to the present invention.

Optionally, a thin layer of aluminum (not shown) or other suitable material may be formed overlying the barrier metal layer 23 and underlying the insulating layer 27. Such thin layer, about 200 to 400 Å in thickness, acts as an etch stop when forming the via 40 in the insulating layer 27. This etch stop prevents etching of the underlying barrier metal layer 23. Use of the thin layer as an etch stop becomes important when etching the insulating layer during via formation creates an uneven or rough surface of the barrier metal layer 23. Typically, a rough or uneven barrier metal surface prevents the even formation of an overlying programming layer which is necessary for creating a reliable antifuse structure. An embodiment illustrating the completed antifuse according to the present invention with etch stop layer is shown in FIG. 5.

Figure 2B:
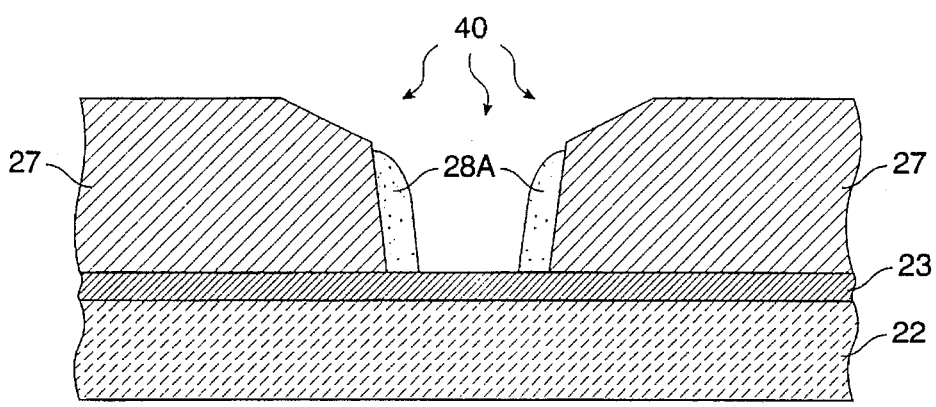

Next, by reactive ion etching, most of the amorphous silicon layer 28 is removed anisotropically. Only spacer regions 28A are along the sides of the via 40 in the insulating layer 27 remain. The layer along the top of the insulating layer 27 and the flat portions of the layer 28 on the barrier metal layer 23 are removed. This is shown in FIG. 2B. Besides amorphous silicon for the layer 28, it should be noted that nonconducting semiconductor materials, such as silicon dioxide, undoped polysilicon, or silicon nitride may be used for the spacer layer 28 so that the spacer regions 28A may also be formed from these materials.

Figure 2C:
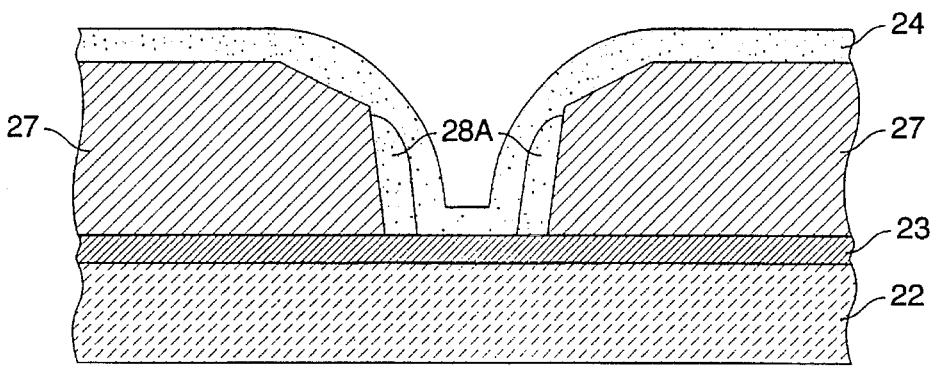

A second layer 24 of amorphous silicon, which performs the function of a programming layer or antifuse layer in the completed antifuse, is then deposited by plasma-enhanced chemical vapor deposition to a thickness of approximately 1000 Å with 10–20% hydrogen concentration. The thickness and hydrogen concentration are adjusted to achieve the desired leakage level. The resulting structure of this step is shown in FIG. 2C. Besides a single layer of amorphous silicon for the programming layer 24, other antifuse layers may be used, such as silicon dioxide and silicon nitride, or multiple antifuse layers. For example, other structures may also include silicon dioxide/silicon nitride/silicon dioxide, silicon nitride/silicon dioxide/silicon nitride, and silicon dioxide/silicon nitride layer combinations.

Figure 2D:
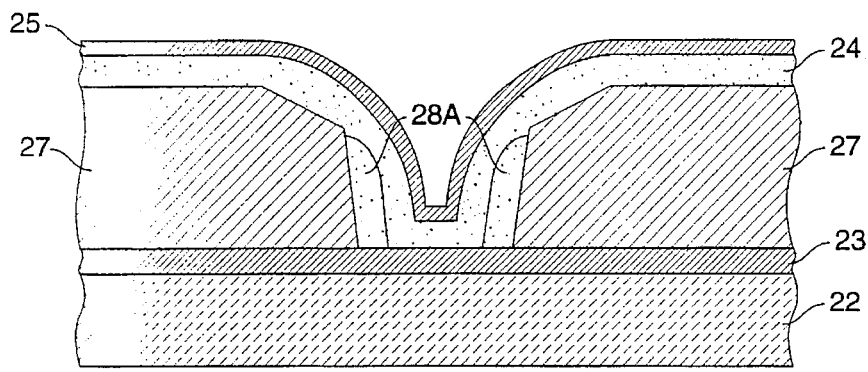
Figure 2E:
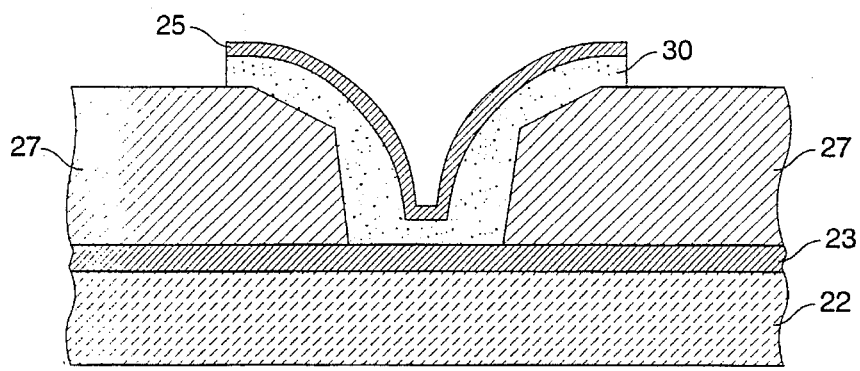

As shown in FIG. 2D, a thin layer 25 of barrier metal, also called a conductive layer or electrode, such as titanium-tungsten, is then deposited to a thickness of approximately 500 Å. The layer 25 helps to protect the programming layer 24 during subsequent processing steps and may be eliminated if it is determined to be unnecessary. Then an antifuse mask is used to delineate the titanium-tungsten layer 25 and the amorphous silicon layer 24 around the via 40. Since the amorphous silicon spacers 28A and the amorphous silicon layer 24 formed an integrated layer, the combined layer is shown as layer 30 in FIG. 2E.

Figure 2F:
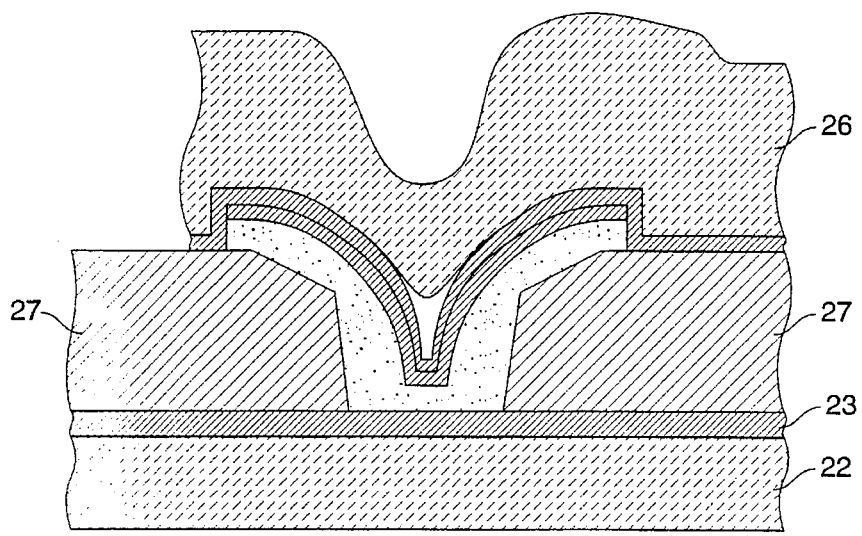

To complete the antifuse structure, another barrier metal layer 29 of titanium-tungsten is deposited. This is followed by another layer 26 of aluminum. The aluminum layer 26 and titanium-tungsten layer 29 are then delineated by a mask to form a second metal interconnection line of the integrated circuit. This is shown in FIG. 2F. Of course, not shown are the passivating layers above the structure which typically follow in a semiconductor manufacturing process.

Figure 4:
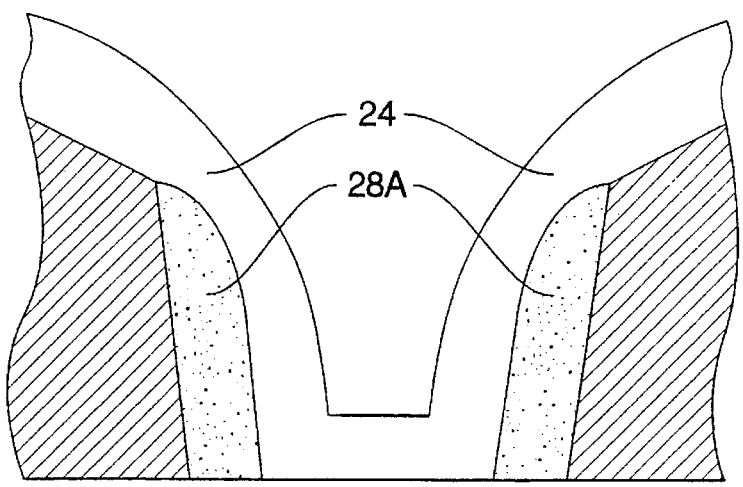
FIG. 4 is a detailed view of one corner of an antifuse according to the present invention.

FIG. 4 includes the details of the spacers 28A and the overlying amorphous silicon layer 24 which form part of the antifuse structure according to the present invention. The structure eliminates the thinning of the amorphous silicon layer 30 at the corners of the via, unlike the antifuse of FIG. 1A and 1B. The structure includes an effective thickness (represented by the double headed arrow) of both programming layer 24 and spacer 28A at the via corners. By eliminating such thinning of the amorphous silicon layer, link formation occurs away from the interlayer dielectric oxide, thereby distributing thermal energy more symmetrically around the link and creating a more reliable antifuse. Step coverage is improved for the second metal interconnection line. Furthermore, since the cross-sectional area of the antifuse is reduced by the spacers, capacitance of the unprogrammed antifuse is lowered, which improves the overall electrical performance of the integrated circuit, and even yields might be enhanced if defects in the programming layer are significant.

Figure 3A:
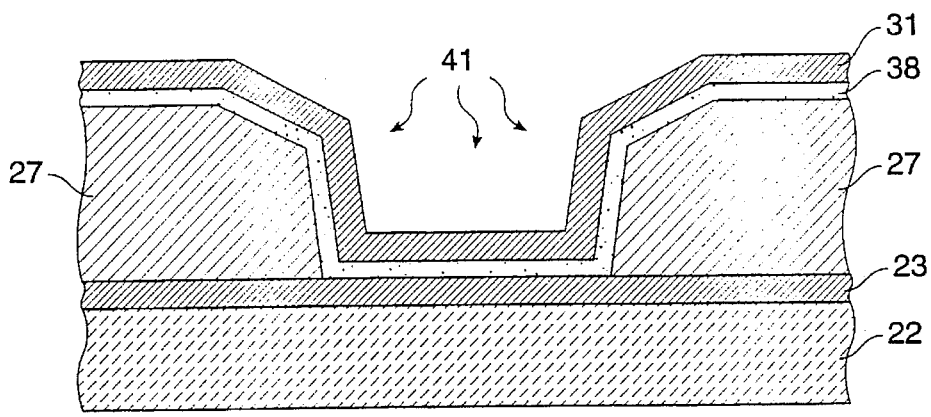
FIGS. 3A–3E show a sequence of steps used to manufacture an antifuse structure according to another embodiment of the present invention.

The steps of manufacturing an antifuse according to another embodiment of the present invention are shown in FIGS. 3A–3E. FIG. 3A shows the point of the process in which a via 41 has been formed in the insulating layer 27, the interlayer dielectric, to expose the top of the titanium-tungsten layer 23, also called a conductive layer or electrode, which forms part of the first metal interconnecting line, is shown. A thin layer of amorphous silicon 38 is deposited over the insulating layer 27 and in the via 41. The thickness of the amorphous silicon layer 38 is approximately 500 Å. This is followed by a layer of silicon nitride 31 of approximately 1000 Å thickness.

Figure 3B:
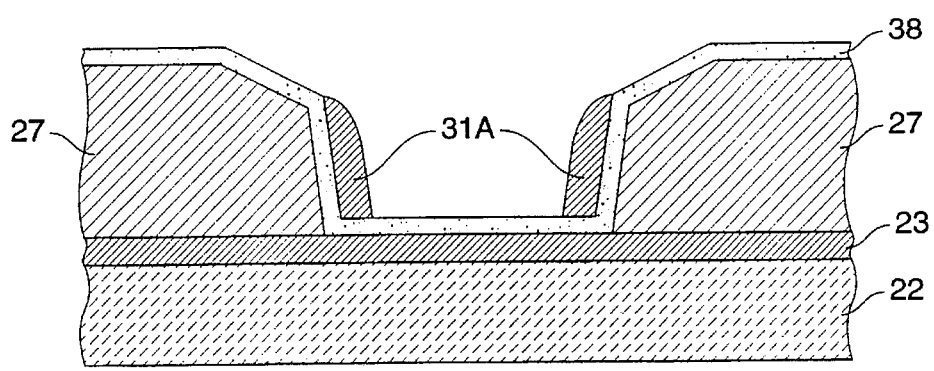
Figure 3C:
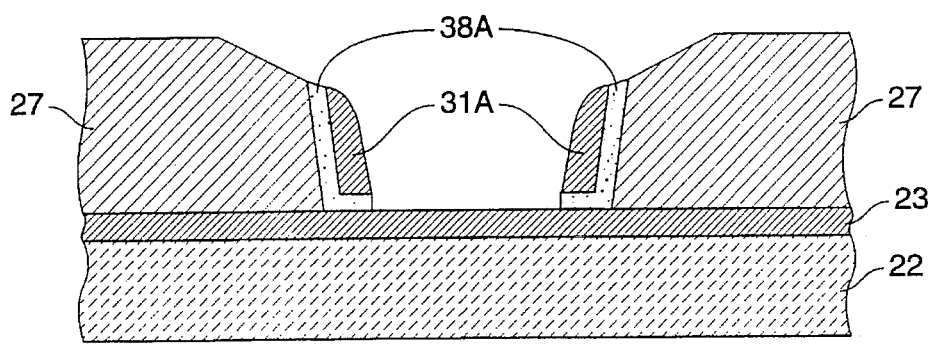

As shown in FIG. 3B, most of the silicon nitride layer 31 is removed by anisotropic reactive ion etching to leave spacers 31A along the sides of the via through the insulating layer 27. A second selective reactive ion etching step follows, as illustrated in FIG. 3C. The silicon nitride spacers 31A are used as a mask to etch the underlying amorphous silicon layer 38 in this step.

Figure 3D:
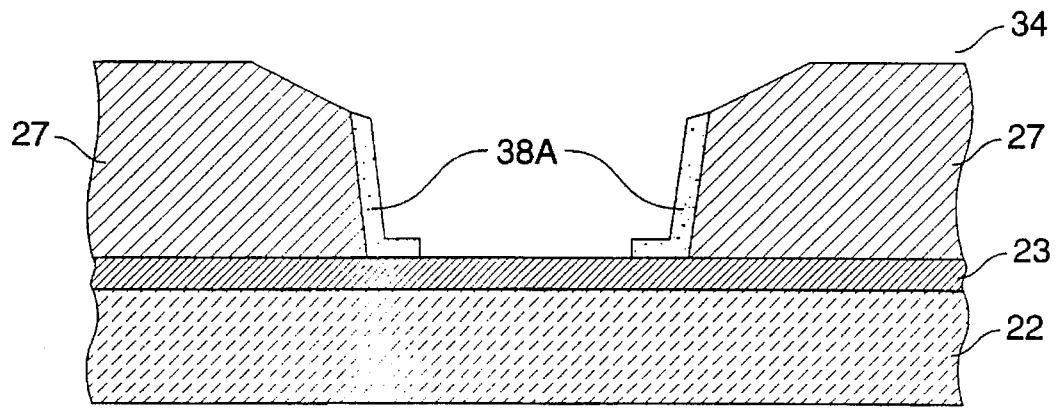

Thereafter, the silicon nitride spacers 31A are removed by an isotropic etching step, preferably a wet etching step, to leave only amorphous silicon spacers 38A, as shown in FIG. 3D. As explained above, other nonconductive semiconductor materials, besides amorphous silicon, may be used for the layer 38 to form the spacer regions 38A. These materials include silicon dioxide and undoped polysilicon. The choice of the materials for the spacer regions depends upon the material used for the programming layer and the particular requirements of the spacer regions. There are advantages if the same material is used for both the spacer regions and the programming layer, such as a reduction in processing complexity.

Over the spacers 38A there is deposited a programming layer 34, also called an antifuse layer, of amorphous silicon of approximately 1000 Å thickness. As explained above, other antifuse materials, besides amorphous silicon, may be used for this layer and other structures, besides a single layer, may be used.

Figure 3E:
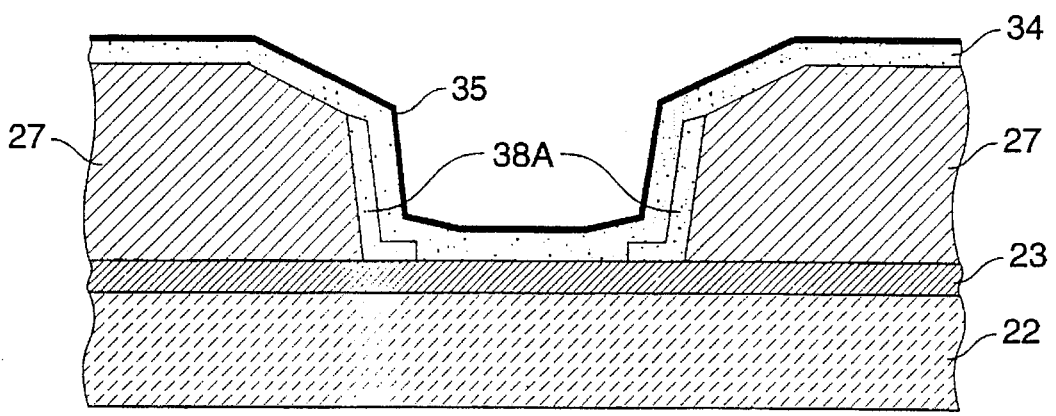

Over the amorphous silicon layer 34 a thin layer 35 of titanium-tungsten of 500 Å thickness is then deposited, shown in FIG. 3E. As explained previously, the thin layer 35, also called a conductive layer or electrode, protects the programming layer 34 from subsequent process steps and may be avoided if the subsequent process steps do not adversely affect the layer 34. Then, similar to the step illustrated in FIG. 2E, an antifuse mask is placed over the TiW layer 34 to define the layer 34 and the amorphous silicon layer 35 in the via 41 and its surrounding areas.

This step is followed by a deposition of a layer 39 (not shown) of titanium tungsten and a layer 36 (not shown) of aluminum. The two layers 39 and 36 are then masked and etched to define the second metal interconnection layer, similar to FIG. 2F.

The result is that with the amorphous silicon spacers on the sides of the via through the insulating layer 27, a thick region of amorphous silicon is formed at the corners of the via. The thick region includes a thickness from 2,000 to 4,000 Å, and preferably about 3,000 Å. As shown in FIG. 4, the amorphous silicon is most thin in the center of the via so that breakdown occurs in that region. The thickness of the amorphous silicon at the via center is from 1,000 to 2,000 Å, and preferably about 1,500 Å. Control of the thickness of the amorphous silicon layer is much better which leads to much more predictable and consistent programming voltages. Furthermore, more barrier metal, titanium tungsten in this case, is available to combine with the amorphous silicon, forming the conducting silicide link once an antifuse is programmed. This availability of barrier metal forms a lower resistance connection and more reliable connection for the programmed antifuse.

FIG. 5 illustrates the other alternative embodiment of FIG. 2F with the thin etch stop layer 51 on the barrier metal layer 23. Thin etch stop layer includes materials, such as aluminum or other suitable material, and is formed overlying the barrier metal layer 23 and under the insulating layer 27. Such thin layer, about 200 to 400 Å in thickness, acts as an etch stop when forming the via 40 in the insulating layer 27. Use of the thin layer as an etch stop becomes important when uneven or rough barrier metal surfaces are created after etching through the insulating layer 27. Typically, a rough or uneven barrier metal surface prevents the even formation of an overlying programming layer which is necessary for creating a reliable antifuse structure. The etch stop layer structure of FIG. 5 is shown for illustrative purposes only. Generally, such etch stop layer structure may be applied to almost any structure where a dielectric layer is etched to expose a barrier metal surface.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the appended claims.

What is claimed is:

1. An antifuse structure in an integrated circuit device, said integrated circuit device formed within and on a semiconductor substrate, said antifuse structure comprising:

a first metal layer on a first insulating layer over said substrate;

a first refractory metal layer on said first metal layer;

a second insulating layer over said first metal layer and said first refractory metal layer, said second insulating layer having an aperture exposing said first refractory metal layer therein;

an amorphous silicon layer in said aperture, said amorphous silicon layer having a first region on said first refractory metal layer and displaced from sides of said second insulating layer in said aperture, and a second region on said sides of said second insulating layer, said first region having substantially a first thickness, said second region having substantially a second thickness, said second thickness greater than said first thickness;

a second refractory metal layer on said amorphous silicon layer; and a second metal layer on said second refractory metal layer;

whereby, upon programming of said antifuse structure, a conducting link is formed in said first region of said amorphous silicon layer.

2. An antifuse structure as in claim 1 wherein said first region of said amorphous silicon layer is in the range of about 1,500 Å thick and said second region of said amorphous silicon layer is in the range of about 3,000 Å thick.

3. An antifuse structure in an integrated circuit device, said integrated circuit device formed within and on a semiconductor substrate, said antifuse structure comprising:

a first metal interconnection layer on a first insulating layer over said substrate;

a second insulating layer over said first metal interconnection layer and said first metal interconnection layer, said second insulating layer having an aperture therethrough to expose a top surface of said first metal interconnection layer to define sides of said second insulating layer in said aperture;

a spacer region in said aperture, said spacer region on said sides of said second insulating layer in said aperture wherein said spacer region comprises nonconducting semiconductor material from the group consisting of amorphous silicon, undoped polysilicon, silicon dioxide, and silicon nitride;

a programming layer in said aperture, said programming layer having a region on said first metal interconnection layer and displaced from sides of said second insulating layer in said aperture; and a second metal interconnection layer on said programming layer;

whereby, upon programming of said antifuse structure, a conducting link is formed in said region of said programming layer.

4. An antifuse structure as in claim 3 wherein both first and second metal interconnection layers comprise a refractory metal layer.

5. An antifuse structure as in claim 4 wherein said region of said programming layer is in the range of approximately 1000 Å thick.

6. An antifuse structure as in claim 3 wherein said spacer region comprises a nonconducting semiconductor material from the group consisting of amorphous silicon, undoped polysilicon, silicon dioxide and silicon nitride.

7. An antifuse structure as in claim 6 wherein said programming layer comprises nonconducting semiconductor material from the group consisting of amorphous silicon, undoped polysilicon, silicon dioxide and silicon nitride.

8. An antifuse structure as in claim 7 wherein said spacer region and said programming layer comprise the same material.

9. An antifuse structure as in claim 4 wherein said first metal interconnection layer comprises an etch stop layer overlying said refractory metal layer.

10. The antifuse structure of claim 9 wherein said etch stop layer comprises aluminum.

11. The antifuse structure of claim 10 wherein said etch stop layer has a thickness ranging from about 200 to 400 Å.

12. An antifuse structure as in claim 1 further comprising an etch stop layer on said first refractory metal layer.

13. The antifuse structure of claim 12 wherein said etch stop layer comprises aluminum.

14. The antifuse structure of claim 13 wherein said etch stop layer has a thickness ranging from about 200 to 400 Å.

* * * * *